(12) United States Patent
Cordero et al.

(10) Patent No.: US 10,096,353 B2
(45) Date of Patent: *Oct. 9, 2018

(54) SYSTEM AND MEMORY CONTROLLER FOR INTERRUPTIBLE MEMORY REFRESH

(71) Applicant: International Business Machines Corporation, Armonk, NY (US)

(72) Inventors: Edgar R. Cordero, Round Rock, TX (US); Carlos A. Fernandez, Hialeah, FL (US); Joab D. Henderson, Pflugerville, TX (US); William P. Hovis, Rochester, MN (US); Jeffrey A. Sabrowski, Leander, TX (US); Anuwat Saetow, Austin, TX (US); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 119 days.

This patent is subject to a terminal disclaimer.

(21) Appl. No.: 14/074,117

(22) Filed: Nov. 7, 2013

(65) Prior Publication Data

US 2015/0127898 A1    May 7, 2015

(51) Int. Cl.
*G11C 11/406*    (2006.01)
*G06F 13/16*    (2006.01)

(52) U.S. Cl.
CPC .... *G11C 11/40603* (2013.01); *G06F 13/1636* (2013.01); *G11C 11/40611* (2013.01); *G11C 11/40618* (2013.01); *G11C 11/40622* (2013.01)

(58) Field of Classification Search
None
See application file for complete search history.

(56) References Cited

U.S. PATENT DOCUMENTS 7,945,727 B2 * 5/2011 Rothberg et al. ............. 711/112
8,797,818 B2    8/2014 Jeddeloh
(Continued)

FOREIGN PATENT DOCUMENTS

| CN | 1815625 A | 8/2006 |
|---|---|---|
| FR | 2844892 A1 | 3/2004 |
| JP | 2006004557 A | 1/2006 |
| KR | 2004003899 A | 1/2004 |

OTHER PUBLICATIONS

Micron, "Various Methods of DRAM Refresh," Micron Technology, Inc., TN-04-30, DT30.p65-Rev. 2/99, originally published in 1994.

(Continued)

*Primary Examiner* — Sean D Rossiter
*Assistant Examiner* — Charles J Choi
(74) *Attorney, Agent, or Firm* — Nolan M. Lawrence

(57) ABSTRACT

A refresh command is communicated to a memory device to initiate an interruptible refresh which contains multiple segment refreshes separated by interrupt boundaries. A command is communicated to the memory device before execution of a segment refresh and the segment refresh is delayed at an interrupt boundary. Alternatively, a first number of commands in a queue is determined. A first number of segment refreshes to execute is determined based on the first number of commands. The first number of segment refreshes to execute is communicated to the memory device to cause execution of the first number of segment refreshes. A second number of commands in the queue is determined. A second number of segment refreshes to execute is determined based on the second number of commands. The second number of segment refreshes to execute is communicated to the memory device to cause execution of the second number of segment refreshes.

17 Claims, 9 Drawing Sheets

(56) References Cited

U.S. PATENT DOCUMENTS

| | | |
|---|---|---|
| 2006/0215474 A1 | 9/2006 | Hokenmaier |
| 2006/0294312 A1* | 12/2006 | Walmsley ............. H04L 9/0662 711/122 |
| 2007/0180187 A1* | 8/2007 | Olson ..................... G06F 12/10 711/106 |
| 2007/0198771 A1 | 8/2007 | Sec |
| 2007/0239930 A1 | 10/2007 | Hearn |
| 2009/0089494 A1* | 4/2009 | Koganezawa ................ 711/106 |
| 2010/0106901 A1 | 4/2010 | Higeta et al. |
| 2011/0283060 A1* | 11/2011 | Ware ................... G06F 13/1636 711/106 |
| 2011/0320701 A1 | 12/2011 | Bronson et al. |
| 2012/0144105 A1* | 6/2012 | Dodson et al. ............... 711/106 |
| 2013/0128682 A1 | 5/2013 | Henderson et al. |
| 2014/0006699 A1 | 1/2014 | Bains et al. |
| 2014/0192605 A1 | 7/2014 | Crawford et al. |

OTHER PUBLICATIONS

J. Mukundan et al., "MORSE: Multi-Objective Reconfigurable Self-Optimizing Memory Scheduler," Computer Systems Laboratory, Cornell University, Ithaca, New York, http://m3.csl.cornell.edu/, 978-1-4673-0826-7/12, In High Performance Computer Architecture (HPCA); 2012 IEEE 18th International Symposium on pp. 1-12, IEEE © 2012 IEEE.

G. Yufeng, "A Data Drivered Refresh with Multi-bit Error-Correcting Power Optimize Method for Cache Based eDRAM," School of Computer Science, National University of Defense Technology, Advanced Engineering Forum vols. 6-7 (2012), pp. 20-025, Sep. 26, 2012, www.scientific.net, © (2012) Trans Tech Publications, Switzerland, doi: 10.4028/www.scientific.net/AEF.6-7.20.

Cordero, E. et al, "Memory Device for Interruptible Memory Refresh."

* cited by examiner

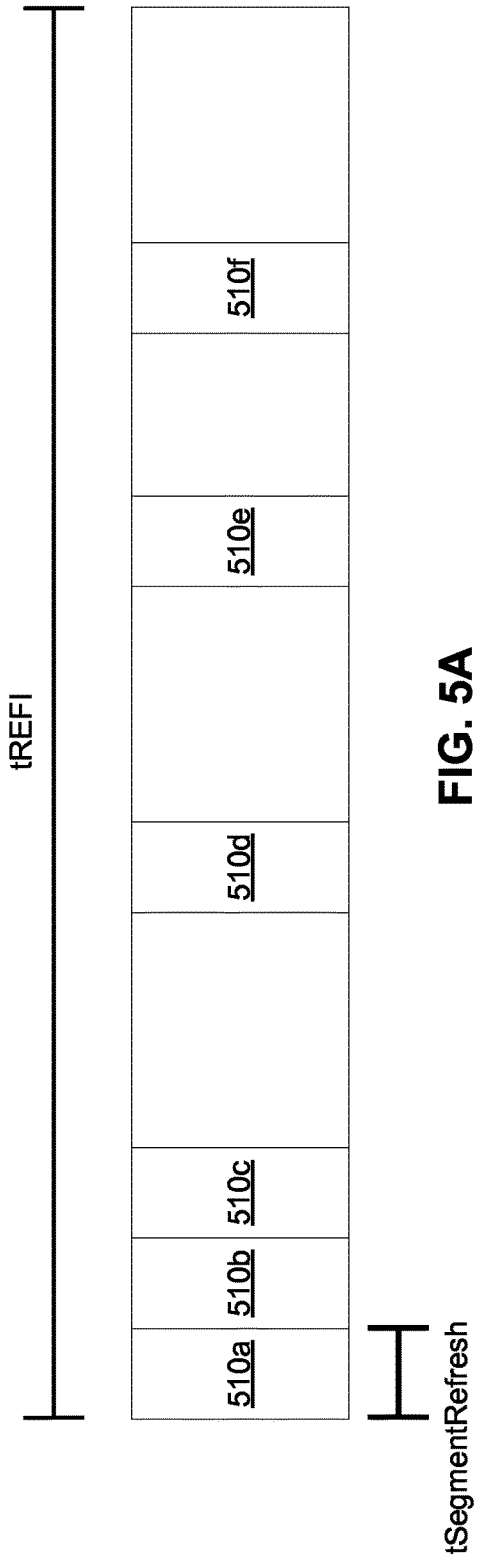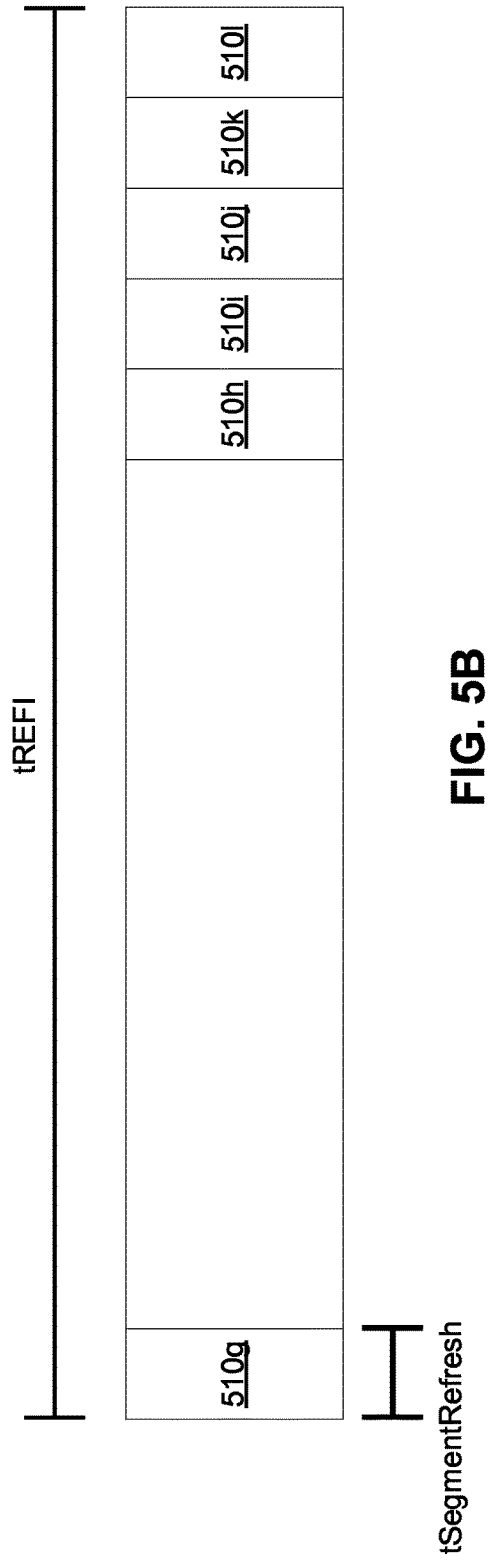
FIG. 5A
FIG. 5B

SYSTEM AND MEMORY CONTROLLER FOR INTERRUPTIBLE MEMORY REFRESH

FIELD OF THE INVENTION

The present disclosure relates to memory systems, and more specifically, to a memory system with dynamic refreshing.

BACKGROUND

As processor speeds continue to increase, memory performance becomes more of a limiting factor in system performance and therefore, memory performance must increase as well. An important aspect of increasing memory performance is increasing the throughput of memory systems. Some memory devices, such as direct random access memory (DRAM) devices require periodic refreshing to prevent data loss. In order to perform a refresh, a memory device enters a refresh mode where the DRAM is not accessible until the refresh has completed execution.

Memory controllers issue refresh commands on a periodic basis so that the DRAM device is refreshed at least once in every predetermined refresh period. The length of the refresh period is dictated by the memory device specifications.

The DRAM typically is not accessible when it is executing the refresh command because typically the memory banks are refreshed at the same time, therefore no memory bank is available for normal access during the refresh period. The memory controller waits until the internal refresh operation has completed before resuming normal operation (e.g., before sending another command such as a read or write command). This period of time when the DRAM is not accessible is referred to as lockout time. Thus, as memory devices increase in size, the amount of time that the memory is locked out or inaccessible increases, affecting system performance.

SUMMARY

Disclosed herein are embodiments of a method for refreshing a memory device performed by a memory controller. The method includes communicating a refresh command to the memory device. The refresh command is configured to initiate an interruptible refresh by the memory device. The interruptible refresh contains a plurality of segment refreshes. The segment refreshes are separated by interrupt boundaries. The method further includes communicating a first command to the memory device before execution of a first segment refresh. The first command is configured to cause the memory device to execute the first command and delay execution of the first segment refresh at a first interrupt boundary.

Also disclosed herein are embodiments of system for refreshing a memory device. The system includes a memory controller. The memory controller is configured to communicate a refresh command to a memory device and to communicate a first command to the memory device before execution of a first segment refresh. The system also includes a memory device. The memory device is configured to initiate an interruptible refresh in response to the refresh command. The interruptible refresh contains a plurality of segment refreshes. The segment refreshes are separated by interrupt boundaries. The memory device is also configured to execute the first command and delay execution of the first segment refresh at a first interrupt boundary.

Also disclosed herein are embodiments for another method for refreshing a memory device performed by a memory controller. The method includes determining a first number of commands in a queue. The method further includes determining a first number of segment refreshes to execute based on the first number of commands. The first number of segment refreshes is less than a total number of segment refreshes normally completed in a refresh interval. The method further includes communicating the determined first number of segment refreshes to execute to the memory device. The communication of the determined first number of segment refreshes to execute is configured to cause the memory device to execute the first number of segment refreshes during the refresh interval. The method further includes determining a second number of commands in the queue. The method further includes determining a second number of segment refreshes to execute based on the second number of commands. The method further includes communicating the determined second number of segment refreshes to execute to the memory device. The communication of the determined second number of segment refreshes to execute is configured to cause the memory device to execute the second number of segment refreshes during the refresh interval.

BRIEF DESCRIPTION OF THE DRAWINGS

FIG. 5A depicts an example timing graphic for a refresh interval of an interruptible refresh.

FIG. 5B shows a second example timing graphic for a refresh interval of an interruptible refresh.

DETAILED DESCRIPTION

Figure 1A:
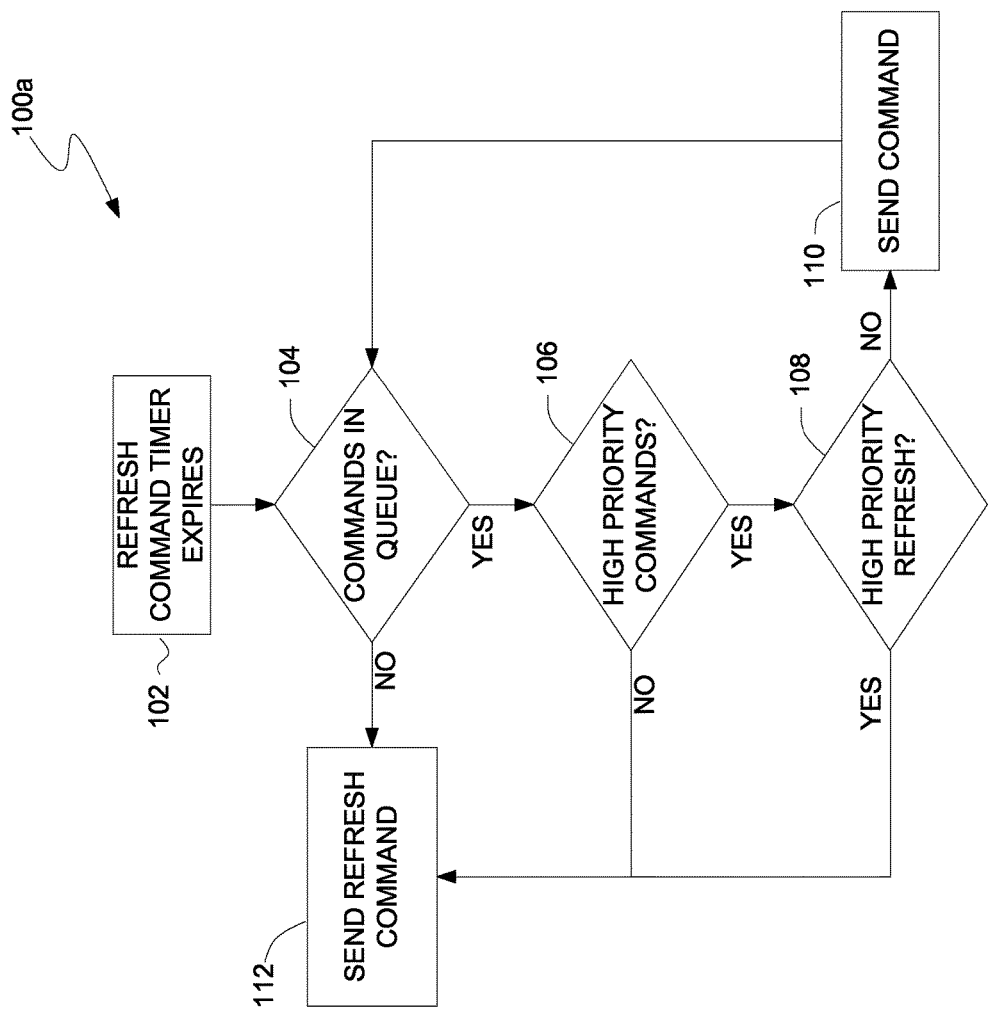
FIGS. 1a and 1b depict flow charts of an example method for refreshing a DRAM.

Some embodiments disclosed herein provide the ability for a memory device, such as a dynamic random-access memory (DRAM), to implement a refresh which may be interrupted by commands sent by the memory controller (also referred to as "interruptible refresh"). Some embodiments provide the ability of a memory controller to determine how many segments to refresh on the memory device at a time. Some embodiments provide the ability of the memory device to execute commands simultaneously with one or more segment refreshes. These embodiments may allow the memory device to execute commands after initiation of a refresh and before the refresh is complete. This may result in a shorter delay of commands due to refreshing.

The term DRAM is used herein when describing embodiments. It will be appreciated that any memory device that requires periodic refreshing to retain stored values may benefit from embodiments described herein. Thus, embodiments described herein are not limited to DRAM devices and embodiments may include any memory device using a dynamic refresh operation.

The term refresh interval ("tREFI") is used herein to describe the maximum amount of time between refreshes determined by memory device specification. In one or more embodiments, the memory controller initiates a refresh command timer which is set to expire at or before expiration of tREFI. After expiration of the timer, the memory controller may send a refresh command to the DRAM and restart the refresh timer.

As used herein, the term segment refresh is used to describe the refresh of a segment of a DRAM. The segment may be any size. The size of each segment refresh may be determined and configured via mode register set commands. The segment size may be determined based on DRAM size, may be optimized for a particular workload, or may be determined by any other method.

In a first set of embodiments, the DRAM may initiate an interruptible refresh comprised of a plurality of segment refreshes in response to receiving the interruptible refresh command from the memory controller at the expiration of the refresh command timer. Each segment refresh may refresh a different segment of the DRAM. The segment refreshes may be separated by interrupt boundaries. The interrupt boundaries may last any specified period of time. For example, the interrupt boundaries may last 1-2 cycles. Alternatively, the interrupt boundaries may be a specific point in time. By specification, the memory controller may keep track of where the DRAM is in the interruptible refresh process and send one or more commands to the DRAM before or during interrupt boundaries. In response to receiving the commands before or during an interrupt boundary, the DRAM may process the commands before executing the next segment refresh to continue the interruptible refresh. In some embodiments, the DRAM may enter another interrupt boundary after processing the commands. If no commands are received, the DRAM may continue the interruptible refresh by executing the next segment refresh.

The memory controller may contain one or more queues of commands which are waiting to be sent to the DRAM. The memory controller may send only commands in the queues which are high priority commands if there are more segment refreshes to execute. The types of commands which are high priority may be predetermined by specification. In some embodiments there may be different levels of priority for commands. Similarly, the memory controller may also determine a priority for the interruptible refresh based on the number of segment refreshes remaining and the amount of time before tREFI expires. The memory controller may compare the priority level of commands in the queues to the priority level for completing the next segment refresh in determining whether to send a command before execution of the next segment refresh. After delaying one or more segment refreshes, there may be a point where the priority for refresh is so high that no level of priority for a command would be higher. This may occur if there is not much time to complete the remaining segment refreshes before expiration of tREFI.

In a second set of embodiments, at expiration of the refresh command timer, the memory controller may communicate a number of segment refreshes to execute to the DRAM. The number of segment refreshes may be less than the total number of segment refreshes which are executed to complete a refresh. The DRAM may perform only the number of segment refreshes communicated to it and wait for further commands from the memory controller. In determining the number of segment refreshes to execute, the memory controller may refer to the number of commands in the queues. In some embodiments, the memory controller may also refer to some performance indicator in determining the number of segment refreshes to execute. The performance indicator may take into account the history of commands to predict the likelihood of future commands. For example, if there have recently been many commands to be sent to the DRAM, it is more likely that there will be many commands in the near future.

The memory controller may determine that no segment refreshes should be executed by the DRAM and the refresh can be postponed. Instead, the memory controller may communicate one or more commands to the DRAM and delay sending segment refreshes to execute. The memory controller may be required to communicate the remaining number of segment refreshes to execute with enough time for the DRAM to finish execution of the segment refreshes before expiration of tREFI.

In a third set of embodiments, at expiration of the refresh command timer, the memory controller may communicate a refresh command to the DRAM. The DRAM may start a refresh by executing a segment refresh. The refresh may be comprised of several segment refreshes with each segment refresh executing on one or more banks. The memory controller may communicate one or more commands to the DRAM during the refresh which can be executed on a bank which is not currently being refreshed. The bank may have already been refreshed or will be refreshed later. In some embodiments, the memory controller will only send commands which can be executed before the segment refresh is set to be executed on that bank. In some embodiments, the refresh is an interruptible refresh and a segment refresh will be delayed if a command is being executed on the bank on which the segment refresh is to be executed. The segment refreshes to be executed after the delayed segment refresh may also be delayed.

Embodiments of the current invention will now be described with reference to the figures. FIG. 1a depicts a flow diagram of an example method for sending a refresh command by a memory controller. At step 102, the refresh command timer expires. The refresh command timer may initially be started after memory initialization during system boot up. At step 104, the memory controller determines if there are commands in the queues waiting to be sent to the DRAM. If there are no commands in the queues, the memory controller may continue to step 112 and send a refresh command. If there are commands in the queues, the memory controller may proceed to step 106. At step 106, the memory controller determines if there are high priority commands. If there are no high priority commands, the memory controller may proceed to step 112 and send the refresh command. If there are high priority commands, the memory controller may proceed to step 108.

At step 108, the memory controller determines if the refresh is high priority. The priority level of the refresh may be determined based on the time required to execute the refresh and the time left before expiration of tREFI. If there is a high priority refresh, the memory controller may proceed to step 112 and send the refresh command. If there is not a high priority for refresh, the memory controller may proceed to step 110 and send a command to the DRAM.

In some embodiments, different levels of priority are determined for commands in the queues at step 106. Similarly, a level of priority for the refresh may be determined at step 108. The level of priority of the command may be compared to the level of priority of the refresh to determine whether to allow the refresh to continue or send the command. At some point the priority of the refresh may reach a level which will result in the memory controller sending the refresh command regardless of the priority level of the command.

In some embodiments, the memory controller may go directly from step 102 to step 112 and send the refresh command in response to expiration of the refresh command timer.

Figure 1B:
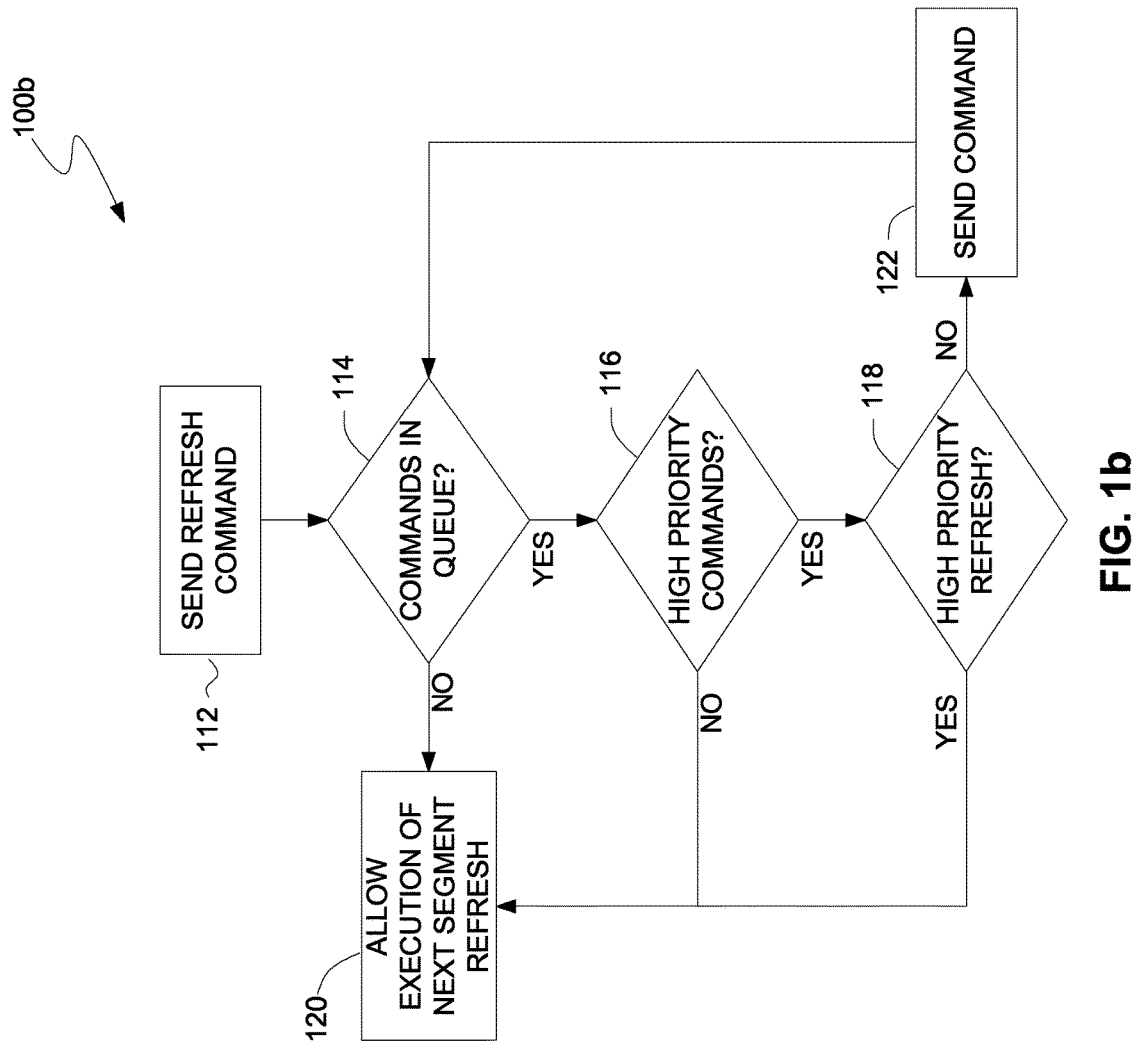

FIG. 1b depicts a flow chart 100b of an example method for refreshing a DRAM which is performed by a memory controller. At step 112, the memory controller sends a refresh command to the DRAM. In response to the refresh command, the DRAM initiates an interruptible refresh comprising a plurality of segment refreshes which are separated by interrupt boundaries.

At step 114, the memory controller determines if there are commands in the queues waiting to be sent to the DRAM. If there are no commands in the queues, the memory controller may continue to step 120 and allow execution of the next segment refresh. If there are commands in the queues, the memory controller may proceed to step 116. At step 116, the memory controller determines if there are high priority commands. If there are no high priority commands, the memory controller may proceed to step 120 and allow execution of the next segment refresh. If there are high priority commands, the memory controller may proceed to step 118.

At step 118, the memory controller determines if the refresh is high priority. The priority level of the refresh may be determined based on the time required to execute the remaining segment refreshes and the time left before expiration of tREFI. If there is a high priority refresh, the memory controller may proceed to step 120 and allow the next segment refresh to complete. If there is not a high priority for refresh, the memory controller will proceed to step 122.

At step 122, the memory controller sends one or more commands to the DRAM at the interrupt boundary. By specification the memory controller may keep track of where the DRAM is in the refresh progress. The memory controller may, by specification, know how long each segment refresh lasts and the length of the interrupt boundary. The memory controller may have a segment refresh timer. In some embodiments the controller may send the one or more commands prior to the interrupt boundary. In response to receiving the commands, the DRAM executes the commands and delays execution of the next segment refresh at the interrupt boundary until after the commands are executed.

In some embodiments, the memory controller may proceed directly from step 114 to step 122 and send the commands to the DRAM without determining priority of the commands or the refresh. However, if the refresh is interrupted for long enough, the memory controller may stop sending commands to allow the refresh to complete before expiration of tREFI.

In some embodiments, different levels of priority are determined for commands in the queues at step 116. Similarly, a level of priority for the refresh may be determined at step 118. The level of priority of the command may be compared to the level of priority of the refresh to determine whether to allow the refresh to continue or send the command. At some point the priority of the refresh may reach a level which will result in the memory controller allowing the refresh to continue regardless of the priority level of the command.

Figure 2:
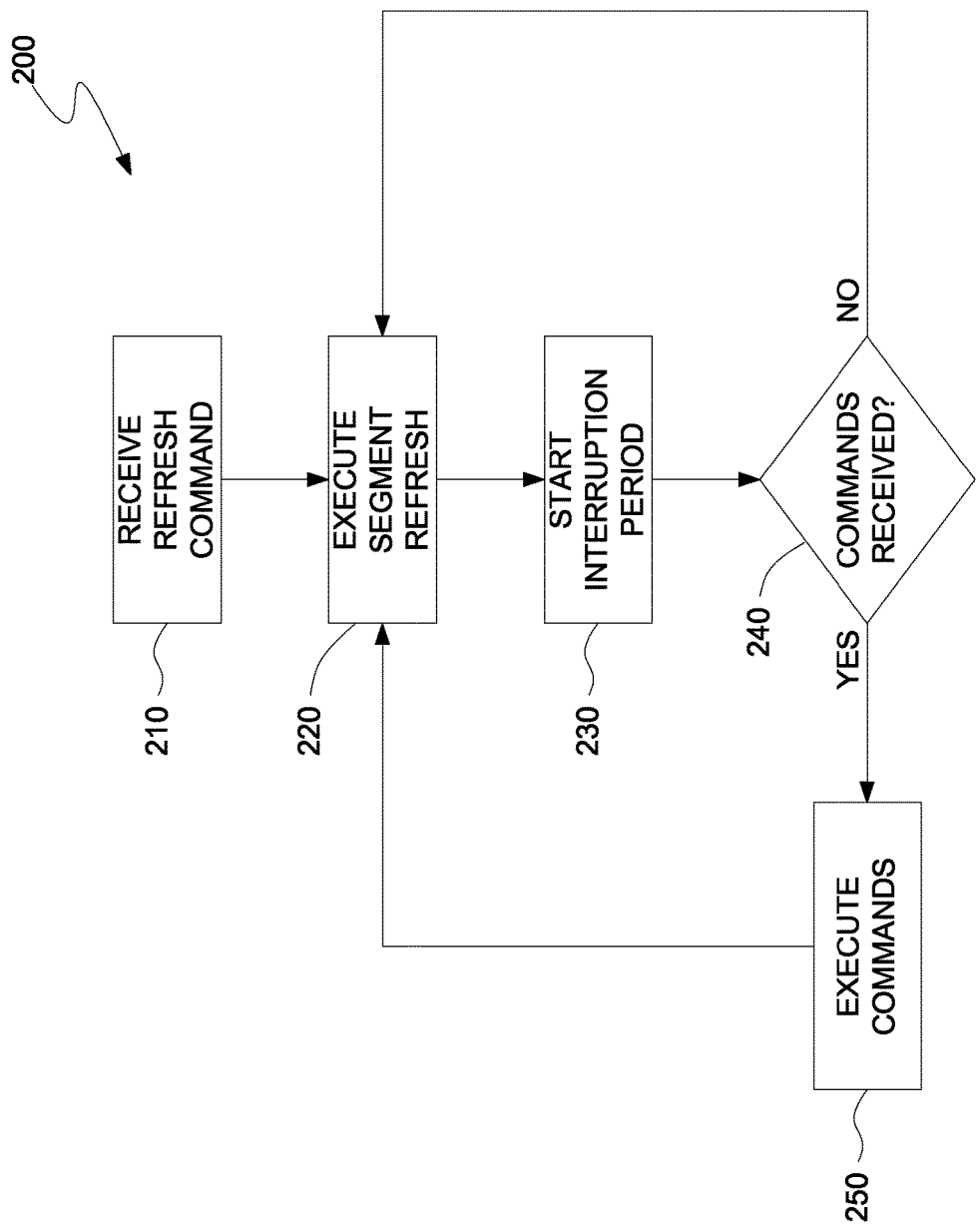
FIG. 2 depicts a flow chart of an example method for refreshing a DRAM which is performed by the DRAM.

FIG. 2 depicts a flow chart 200 of an example method for refreshing a DRAM which is performed by the DRAM. At step 210, a refresh command is received from the memory controller. The DRAM starts an interruptible refresh in response to receiving the refresh command with execution of a segment refresh at step 220. After completion of the segment refresh, the DRAM may reach an interrupt boundary at step 230. The interrupt boundary may be any length including simply the point in time between two segment refreshes. In some embodiments the interrupt boundary lasts a short amount of time such as 1-2 cycles. At step 240, it is determined whether a command is received at the interrupt boundary. In some embodiments, commands may be received before the interrupt boundary. If no command is received, the DRAM returns to step 220 and executes the next refresh segment. If one or more commands are received, the DRAM proceeds to step 250. At step 250, the DRAM executes the one or more commands before returning to step 220 and executing the next segment refresh. This process may continue until all of the segment refreshes have been executed.

Figure 3:
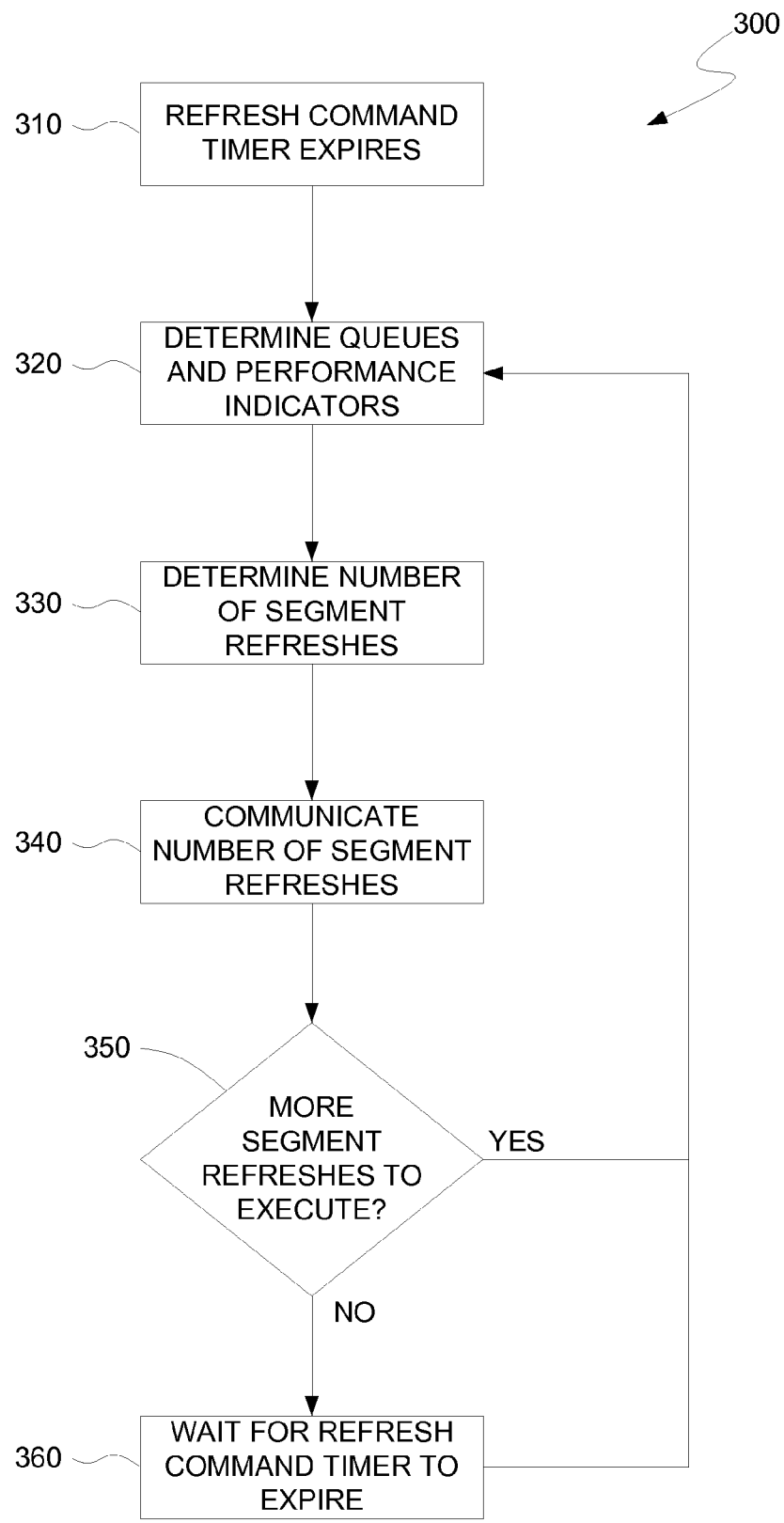
FIG. 3 depicts a flow chart of a second example method for refreshing a DRAM.

FIG. 3 depicts a flow chart 300 of a second example method for refreshing a DRAM which is performed by a memory controller. At step 310, the refresh command timer expires. At step 320, the memory controller determines the number of commands in the queues and performance indicators. The performance indicators may represent the level of activity of the DRAM in the past such as the recent history of commands sent to the DRAM. At step 330, the memory controller determines a number of segment refreshes to execute based on the number of commands in the queues and the performance indicators. For example, the memory controller may determine a large number of segment refreshes to execute if there are no commands in the queues or there have been very few commands sent to the DRAM recently. Alternatively, the memory controller may determine a small number of segment refreshes if there are a lot of commands in the queues or there have been many commands sent to the DRAM recently. The memory controller may determine that no segment refreshes should be executed.

At step 340, the memory controller communicates the number of refresh segments to execute to the DRAM. The number of refresh segments may be less than the total number of refresh segments normally completed in a refresh interval. Alternatively, if the memory controller determined that no segment refreshes should be executed, the memory controller may communicate commands to the DRAM. At step 350, the memory controller determines whether there are more segment refreshes to execute to complete the refresh within the refresh interval. If there are more segment refreshes, the memory controller may return to step 320. If there are no more segment refreshes to execute, the memory controller may continue to step 360. At step 360, the memory controller may communicate commands to the DRAM and wait for the refresh command timer to expire before returning to step 320.

Figure 4:
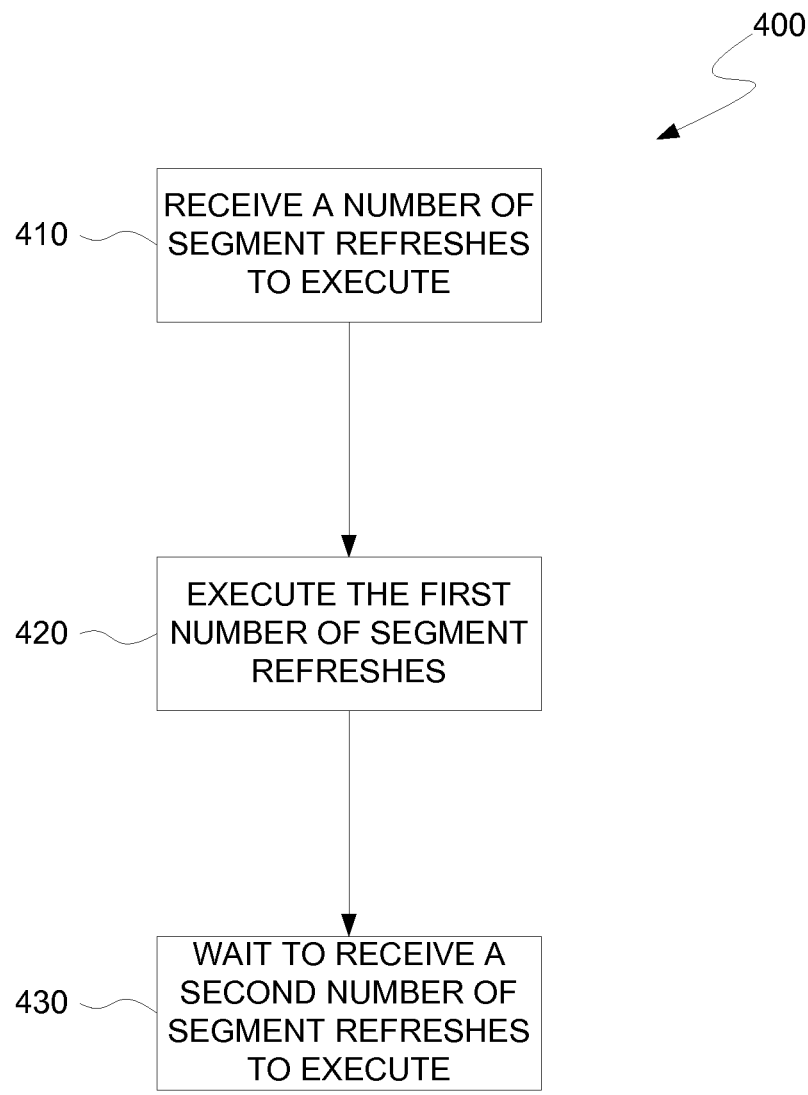
FIG. 4 depicts a flow chart of a second example method of refreshing a DRAM which is performed by the DRAM.

FIG. 4 depicts a flow chart 400 of a second example method of refreshing a DRAM which is performed by the DRAM. At step 410, the DRAM receives a number of segment refreshes to execute from the memory controller. At step 420, the DRAM executes the first number of segment refreshes. The segment refreshes may be executed one at a time. At step 430, the DRAM waits to receive a second number of segment refreshes to execute. While waiting, the DRAM may continue to receive and execute commands communicated by the memory controller.

FIG. 5A depicts an example timing graphic for a refresh interval of an interruptible refresh. As shown, the length of the refresh interval is marked as tREFI and runs the length of the graphic. In the illustrated example there are 6 segment refreshes 510a to 510f. Each segment refresh takes time tSegmentRefresh to complete. The timing graphic could be the result of performing methods illustrated in FIGS. 2 and 4.

With respect to the method illustrated in FIG. 2, segment refresh 510a is executed at the beginning of the refresh period in response to an interruptible refresh command from the memory controller. Following execution of segment refresh 510a the DRAM reached an interrupt boundary. In the illustrated example, no command was sent to the DRAM during the interrupt boundary, so the DRAM continued with the interruptible refresh and executed segment refresh 510b. After execution of segment refresh 510b, the DRAM entered another interrupt boundary during which the DRAM did not receive a command. The DRAM proceeded to execute segment refresh 510c.

Following execution of 510c, the DRAM entered an interrupt boundary during which one or more commands were received from the memory controller. The DRAM processed the one or more commands and delayed the execution of segment refresh 510d. Similarly, commands were received during the interrupt boundaries following segment refreshes 510d and 510e which delayed execution of refreshes 510e and 510f respectively. Following execution of refresh segment 510f the interruptible refresh was complete for this tREFI and the DRAM was free to receive commands.

With respect to the method illustrated by FIG. 4, at the beginning of the refresh interval the DRAM executed refresh segments 510a to 510c. This may occur if the memory controller determined and communicated three segment refreshes to execute. Alternatively, the memory controller may have determined and communicated one segment refresh to execute followed by determining and communicating two segment refreshes to execute or vice versa. After execution of segment refresh 510c, the memory controller may have determined not to send a number of segment refreshes to execute. Instead the memory controller may have sent commands to the DRAM. Eventually the memory controller determined and communicated one segment refresh to the DRAM and the DRAM executed segment refresh 510d. Similarly, this happened for refresh segments 510e and 510f.

FIG. 5B shows a second example timing graphic for a refresh interval of an interruptible refresh. With respect to the method illustrated by FIG. 2, the DRAM executes segment refresh 510g in response to receiving an interruptible refresh command from the memory controller. During the interrupt boundary following execution of segment refresh 510g the DRAM may have received one or more commands. The commands were executed before execution of segment refresh 510h. In the illustrated example, the segment refreshes 510h-l could not be delayed longer and still be completed before the end of tREFI. Therefore, the memory controller may have had additional commands in the queues to send to the DRAM, but did not send them to allow the interruptible refresh to complete. In some embodiments, this may be the result of the refresh priority becoming higher than the priority for the commands. Completion of the interruptible refresh by the expiration of tREFI may be required by memory controller specification.

With respect to the method illustrated by FIG. 4, the DRAM executes segment refresh 510g in response to receiving a communication from the memory controller to execute one segment refresh. Following execution of segment refresh 510g, the memory controller determined not to send a number of segment refreshes to the DRAM. The memory controller may have determined and communicated to the DRAM to execute five segment refreshes. In response, the DRAM executed segment refreshes 510h-l. In the illustrated example, the segment refreshes 510h-l could not be delayed longer and still be completed before the expiration of tREFI. Therefore, the memory controller may have had additional commands in the queues to send to the DRAM and had many commands sent to the DRAM recently, but the memory controller determined to have the DRAM perform the remaining segment refreshes. This may be required by the DRAM specification.

Figure 6:
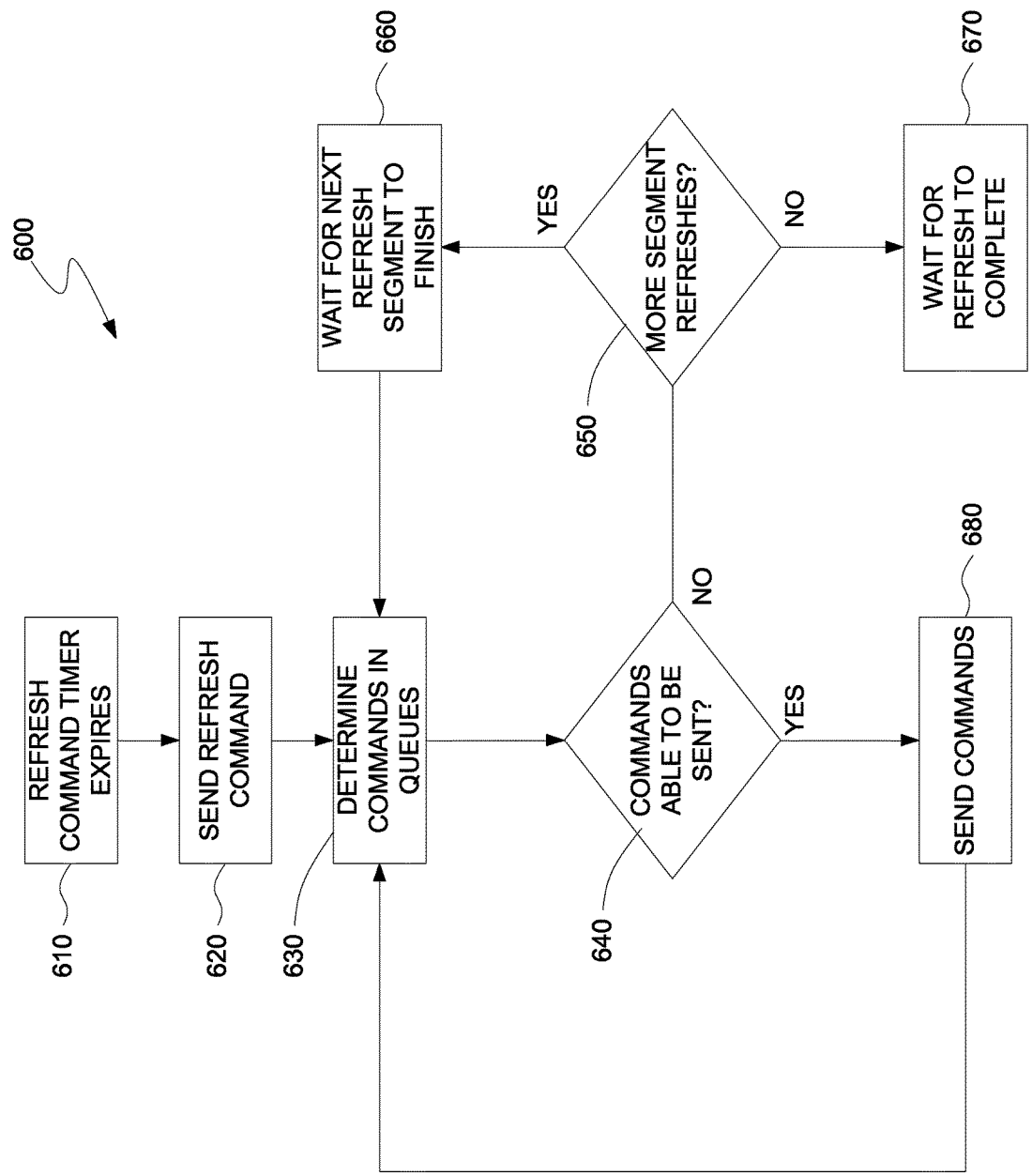
FIG. 6 depicts a flow chart of a third example method for refreshing a DRAM.

FIG. 6 depicts a flow chart 600 of a third example method for refreshing a DRAM performed by a memory controller. At step 610, the refresh timer expires. At step 620, the memory controller sends a refresh command to the DRAM in response to the expiration of the refresh timer. The refresh command may be configured to cause the DRAM to initiate a series of segment refreshes where each segment refresh executes on one or more banks. The segment refreshes may be spread out over time such that they do not overlap. At step 630, the memory controller determines what commands are in the queues.

At step 640, the memory controller determines whether there are commands which are able to be sent to the DRAM. The commands may be able to be sent to the DRAM if the bank on which the command will be executed is not currently being refreshed and will not be refreshed before completion of the command. If commands are able to be sent, the memory controller may proceed to step 680 and send the commands. The commands may be executed at least partially simultaneously with a segment refresh which is executing on a different bank. If the commands are not able to be sent, the memory controller may proceed to step 650. At step 650, the memory controller determines if there are more segment refreshes to be executed. If there are no more segment refreshes to execute, the memory controller may proceed to step 670 and wait for the refresh to complete at which point all banks may be available for executing commands. If there are more segment refreshes to execute at step 650, the memory controller may proceed to step 660 and wait for the next refresh segment to complete. After completion of the next refresh segment, the memory controller may return to step 630.

Figure 7:
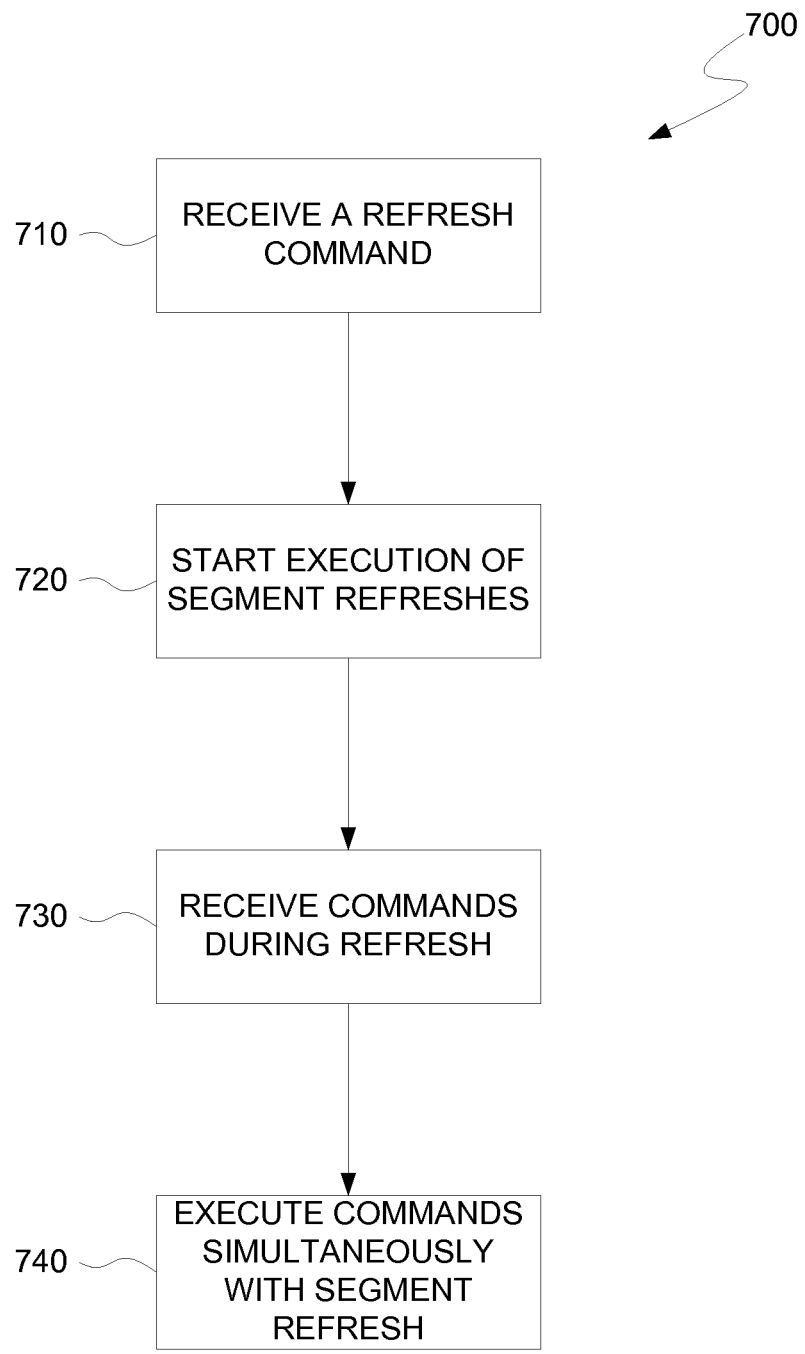
FIG. 7 depicts a flow diagram of a third example method for refreshing a DRAM performed by the DRAM.

FIG. 7 depicts a flow diagram 700 of an example method for refreshing a DRAM performed by the DRAM. At step 710, the DRAM receives a refresh command from the memory controller. At step 720, the DRAM may start execution of a series of segment refreshes in response to receiving the refresh command. The segment refreshes may each execute on separate banks. The segment refreshes may be separated in time such that they do not overlap. At step 730, the DRAM receives one or more commands from the memory controller while the refresh is still executing. At step 740, the DRAM executes the commands on an open bank while simultaneously performing a segment refresh on one or more of the other banks In some embodiments, the refresh may be an interruptible refresh and commands executing on a bank may delay the start of the next segment refresh that will execute on the same bank.

Some embodiments of the current invention may involve use of a 3D stacked memory. In these embodiments, some of the memory controller functions described above may be performed by the 3D stacked memory's logic chip. For example, the logic chip in the stack may receive refresh commands for different ranks from the memory controller and the logic chip may decide to do the interruptible refreshes based on the current operation in different ranks of the stacked chip, or the memory device in the stack can request logic chip to do the interruptible refreshes, since 3D stack chip will have more than one rank in the device and the control can be done from the logic chip instead of memory controller.

Referring to FIG. 1a, steps 104-112 may be performed by the logic chip in response to receiving a refresh command from the memory controller during step 102 at expiration of the refresh command timer. Similarly, referring to FIG. 1b, steps 112-122 may be performed by the logic chip. Additionally, referring to FIG. 3, the logic chip may perform steps 320-360 after receiving a refresh command from the memory controller at the expiration of the refresh command timer during step 310. Furthermore, referring to FIG. 6, the logic chip may perform steps 620-670 after receiving a refresh command from the memory controller at the expiration of the refresh command timer during step 610.

Figure 8:
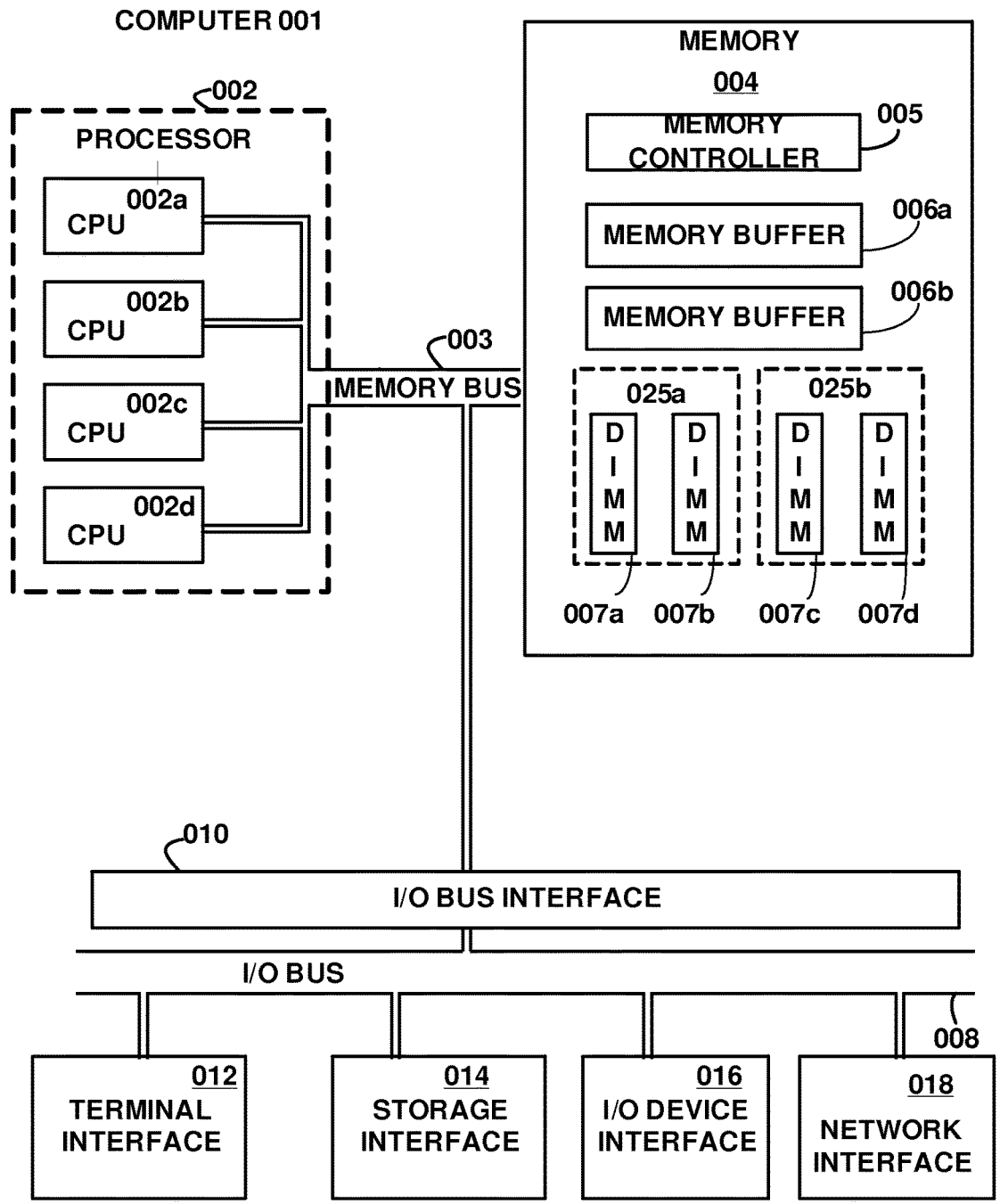
FIG. 8 depicts a high-level block diagram of an example system for implementing an embodiment.

FIG. 8 depicts a high-level block diagram of an example system for implementing an embodiment. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 may contain one or more general-purpose programmable central processing units (CPUs) 002A, 002B, 002C, and 002D, herein generically referred to as the CPU 002. In an embodiment, the computer system 001 may contain multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 may represent the entire virtual memory of the computer system 001, and may also include the virtual memory of other computer systems coupled to the computer system 001 or connected via a network. The memory subsystem 004 may be conceptually a single monolithic entity, but in other embodiments the memory subsystem 004 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, one or more memory buffer 006 and one or more memory devices 007. In the illustrated embodiment, the memory devices 007 may be dual in-line memory modules (DIMMs), which are a series of dynamic random-access memory (DRAM) chips 015a-015n (collectively referred to as 015) mounted on a printed circuit board and designed for use in personal computers, workstations, and servers. The use of DRAMs 015 in the illustration is exemplary only and the memory array used may vary in type as previously mentioned. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001. In other embodiments the components may be arranged differently and have a variety of configurations. For example, the memory controller 005 may be on the CPU 002 side of the memory bus 003. In other embodiments, some or all of them may be on different computer systems and may be accessed remotely, e.g., via a network.

Although the memory bus 003 is shown in FIG. 8 as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, network switches or routers, or any other appropriate type of electronic device.

FIG. 8 is intended to depict the representative major components of an exemplary computer system 001. But individual components may have greater complexity than represented in FIG. 8, components other than or in addition to those shown in FIG. 8 may be present, and the number, type, and configuration of such components may vary. Several particular examples of such complexities or additional variations are disclosed herein. The particular examples disclosed are for example only and are not necessarily the only such variations.

The memory buffer 006, in this embodiment, may be intelligent memory buffer, each of which includes an exemplary type of logic module. Such logic modules may include hardware, firmware, or both for a variety of operations and tasks, examples of which include: data buffering, data splitting, and data routing. The logic module for memory buffer 006 may control the DIMMs 007, the data flow between the DIMM 007 and memory buffer 006, and data flow with outside elements, such as the memory controller 005. Outside elements, such as the memory controller 005 may have their own logic modules that the logic module of memory buffer 006 interacts with. The logic modules may be used for failure detection and correcting techniques for failures that may occur in the DIMMs 007. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffer 006, memory controller 005, CPU 002, and even the DRAM 0015 may use these techniques in the same or different forms. These logic modules may communicate failures and changes to memory usage to a hypervisor or operating system. The hypervisor or the operating system may be a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Embodiments described herein may be in the form of a system, a method, or a computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (an non-exhaustive list) of the computer-readable storage media may comprise: an electrical connection having one or more wires, a portable computer diskette, a hard disk, a random access memory (RAM), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, Radio Frequency, or any suitable combination of the foregoing.

Embodiments of the invention may also be delivered as part of a service engagement with a client corporation, nonprofit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments are not intended to limit the present invention. Indeed, other alternative hardware and/or program environments may be used without departing from the scope of embodiments of the invention.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for refreshing a DRAM performed by a memory controller, the method comprising:
communicating a refresh command, in response to expiration of a refresh timer, to the DRAM, the refresh command configured to initiate an interruptible refresh on the DRAM, the interruptible refresh comprising execution of a plurality of segment refreshes, the execution of each of the plurality of segment refreshes separated by interrupt boundaries, the plurality of segment refreshes comprising a first segment refresh and a second segment refresh, the first segment refresh and the second segment refresh separated by a first interrupt boundary, the DRAM configured to complete the interruptible refresh without additional refresh commands from the memory controller; and communicating, during execution of the refresh command, a first command to the DRAM before execution of the second segment refresh and after execution of the first segment refresh has begun, the first command configured to cause the DRAM to execute the first command at the first interrupt boundary, the first command further configured to cause the DRAM to delay execution of the second segment refresh until after the first command has been executed.

2. The method of claim 1, wherein the communicating the first command to the DRAM occurs at the first interrupt boundary.

3. The method of claim 1, further comprising:
determining that the first command is a high priority command, wherein the communicating the first command occurs in response to the determining.

4. The method of claim 1, further comprising:
determining a priority level for the first command; and
determining a first priority level for the interruptible refresh, wherein the communicating the first command is based on the priority level of the first command and the first priority level of the interruptible refresh.

5. The method of claim 4, further comprising:
determining a priority for a second command;
determining a second priority for the interruptible refresh; and
determining not to communicate a second command to the DRAM based on the priority for the second command and the second priority for the interruptible refresh and allowing a third segment refresh to execute immediately after a second interrupt boundary.

6. The method of claim 1, further comprising:
determining a priority level for the interruptible refresh;
determining priority levels for one or more commands in a queue; and
determining that the priority level for the interruptible refresh is higher than the priority level for each of the one or more commands in the queue, wherein the communicating the refresh command occurs in response to the determining the priority level for the interruptible refresh is higher than the priority level for each of the one or more commands in the queue.

7. The method of claim 1, wherein the communicating the first command to the DRAM occurs during execution of the second segment refresh, the first command configured to cause the DRAM to execute the first command at least partially simultaneously with the second segment refresh.

8. A system for refreshing one or more DRAM modules, the system comprising:
a memory controller, the memory controller configured to:
communicate a refresh command, in response to a refresh timer, to a DRAM; and
communicate a first command to the DRAM after execution of a first segment refresh has begun and before execution of a second segment refresh has begun; and
the DRAM configured to:
initiate an interruptible refresh in response to the communicated refresh command, the interruptible refresh comprising execution of a plurality of segment refreshes, the execution of the plurality of segment refreshes separated by interrupt boundaries, the plurality of segment refreshes comprising the first segment refresh and the second segment refresh, the first segment refresh and the second segment refresh separated by a first interrupt boundary;
execute the first command at the first interrupt boundary after execution of the first segment refresh;
delay execution of the second segment refresh until after the first command has been executed; and
complete the interruptible refresh without additional refresh commands from the memory controller.

9. The system of claim 8, wherein the memory controller is configured to communicate the first command to the DRAM at the first interrupt boundary.

10. The system of claim 8, wherein the memory controller is further configured to:
determine that the first command is a high priority command, wherein the memory controller is configured to communicate the first command based on the determining.

11. The system of claim 8, wherein the memory controller is further configured to:
determine a priority level for the first command; and
determine a first priority level for the interruptible refresh, wherein the communicating the first command is based on the priority level of the first command and the first priority level of the interruptible refresh.

12. The system of claim 11, wherein the memory controller is further configured to:
determine a priority for a second command;
determine a second priority for the interruptible refresh; and
determine not to communicate the second command to the DRAM based on the priority for the second command and the second priority for the interruptible refresh and not delay execution of a third segment refresh at a second interrupt boundary.

13. The system of claim 8, wherein the memory controller is further configured to allow the interruptible refresh to complete before expiration of a refresh interval.

14. The system of claim 8, wherein the memory controller is configured to communicate the first command to the DRAM during execution of the second segment refresh, wherein the DRAM is configured to execute the first command at least partially simultaneously with the second segment refresh.

15. A method for refreshing one or more modules of DRAM, the modules communicatively coupled to one or more memory controllers, the method comprising:
detecting, by a first memory controller, that a DRAM requires a refresh of two or more stored values within the DRAM;
sending, by the first memory controller and based on the detecting, a first command to the DRAM, the first command causing the DRAM to start refresh of the two or more stored values;
sending, by the first memory controller during execution of the refresh command and before completion of the refresh but after start of the refresh by the DRAM, a second command to the DRAM, the second command causing the DRAM to delay refresh of the two or more stored values, the second command causing the DRAM to retrieve information from the two or more stored values; and
receiving, by the first memory controller during execution of the refresh command and before completion of the refresh but after start of the refresh by the DRAM, a response to the second command, the response including the retrieved information from the DRAM.

16. The method of claim 15, wherein the detecting is based on expiration of a refresh timer.

17. The method of claim 15, wherein the DRAM is a singular DRAM module.

\* \* \* \* \*